(12) United States Patent
Seidel et al.

(10) Patent No.: US 8,389,401 B2
(45) Date of Patent: Mar. 5, 2013

(54) CONTACT ELEMENTS OF SEMICONDUCTOR DEVICES FORMED ON THE BASIS OF A PARTIALLY APPLIED ACTIVATION LAYER

(75) Inventors: Robert Seidel, Dresden (DE); Markus Nopper, Dresden (DE); Axel Preusse, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/910,979

(22) Filed: Oct. 25, 2010

(65) Prior Publication Data
US 2011/0156270 A1 Jun. 30, 2011

(30) Foreign Application Priority Data
Dec. 31, 2009 (DE) .......................... 10 2009 055 433

(51) Int. Cl.
*H01L 23/522* (2006.01)
*H01L 21/768* (2006.01)
(52) U.S. Cl. . 438/637; 438/639; 438/641; 257/E21.577; 257/E23.145

(58) Field of Classification Search .................. 438/637, 438/639, 641
See application file for complete search history.

(56) References Cited

U.S. PATENT DOCUMENTS

| 5,219,789 | A | 6/1993 | Adan | 437/192 |
| 5,484,747 | A | 1/1996 | Chien | 437/190 |
| 6,174,813 | B1 | 1/2001 | Wang | 438/692 |
| 6,204,561 | B1 | 3/2001 | Yoshizawa | 257/751 |

FOREIGN PATENT DOCUMENTS
JP 2001323381 A 11/2001

OTHER PUBLICATIONS

Translation of Official Communication from German Patent Office for German Patent Application No. 10 2009 055 433.5 dated Oct. 5, 2010.

*Primary Examiner* — Alexander Ghyka
(74) *Attorney, Agent, or Firm* — Williams, Morgan & Amerson, P.C.

(57) ABSTRACT

When forming contact levels of sophisticated semiconductor devices, a superior bottom to top fill behavior may be accomplished by applying an activation material selectively in the lower part of the contact openings and using a selective deposition technique. Consequently, deposition-related irregularities, such as voids, may be efficiently suppressed even for high aspect ratio contact openings.

17 Claims, 4 Drawing Sheets

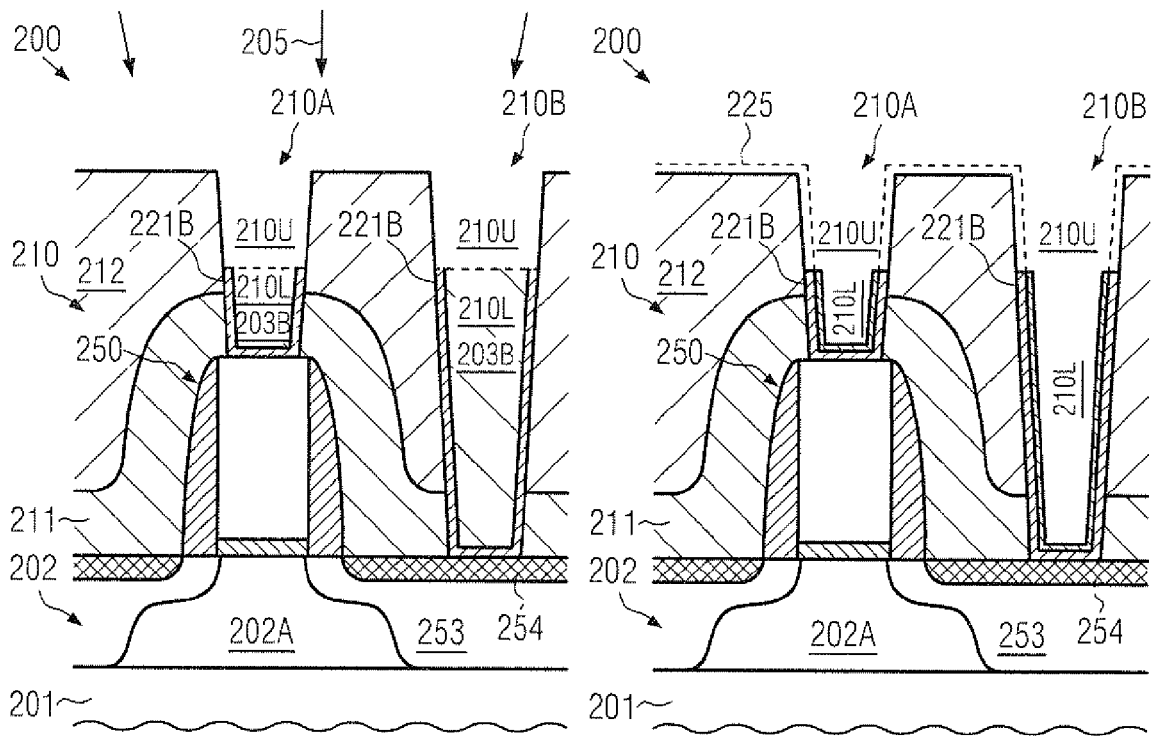
FIG. 2e
FIG. 2f
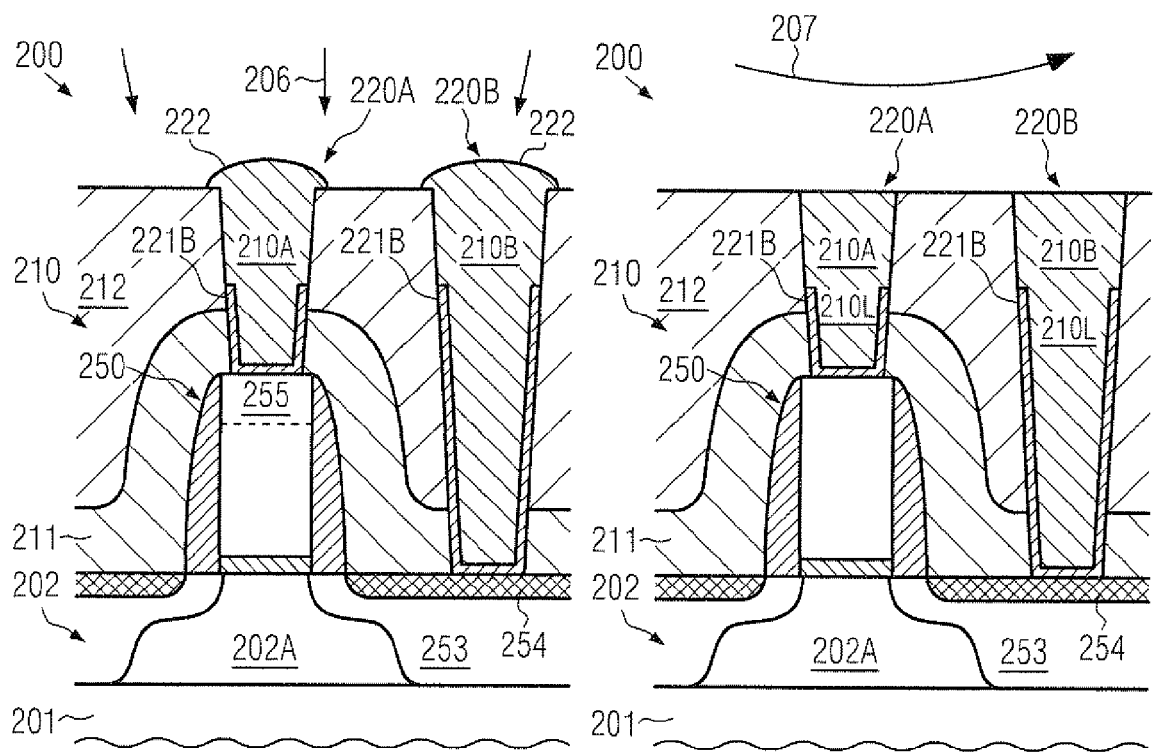
FIG. 2g
FIG. 2h

CONTACT ELEMENTS OF SEMICONDUCTOR DEVICES FORMED ON THE BASIS OF A PARTIALLY APPLIED ACTIVATION LAYER

BACKGROUND OF THE INVENTION

1. Field of the Invention

The present disclosure generally relates to the fabrication of integrated circuits, and, more particularly, to the contact level of a semiconductor device, in which contact areas, such as gate electrodes and drain and source regions, are connected to the metallization system of the semiconductor device on the basis of contact elements.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. However, the continuing scaling of feature sizes involves great efforts in redesigning process techniques and developing new process strategies and tools to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain terminal and a source terminal.

On the basis of the field effect transistors, more complex circuit components may be composed, such as inverters and the like, thereby forming complex logic circuitry, memory devices and the like. Due to the reduced dimensions, the operating speed of the circuit components has been increased with every new device generation, wherein, however, the limiting factor of the finally achieved operating speed of complex integrated circuits is no longer the individual transistor element but the electrical performance of the complex wiring network, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections, which are also referred to as vias. These interconnect structures comprise an appropriate metal and provide the electrical connection of the individual circuit elements and of the various stacked metallization layers.

Furthermore, to establish a connection of the circuit elements with the metallization layers, an appropriate vertical contact structure is provided, which connects to a respective contact region of a circuit element, such as a gate electrode and/or the drain and source regions of transistors, and to a respective metal line in the first metallization layer. The contact structure may comprise contact elements or contact plugs formed in an interlayer dielectric material that encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower lying metallization levels, metal lines and vias having critical dimensions of approximately 100 nm and significantly less may have to be provided in order to achieve the required "packing density" in accordance with the density of circuit elements in the device level.

Upon further reducing the dimensions of the circuit elements, for instance using critical dimensions of 50 nm and less, the contact elements in the contact level may have to be provided with appropriate critical dimensions on the same order of magnitude. The contact elements may typically represent plugs, trenches and the like which are formed of an appropriate metal or metal composition, wherein, in sophisticated semiconductor devices, tungsten, in combination with appropriate barrier materials, has proven to be a viable contact metal. When forming tungsten-based contact elements, typically, the interlayer dielectric material may be formed first and may be patterned so as to receive contact openings, which may extend through the interlayer dielectric material to the corresponding contact areas of the circuit elements. For this purpose, openings of very different depth may have to be formed in the interlayer dielectric material in order to connect to gate electrode structures or any other conductive lines formed above the semiconductor layer, while other contact openings have to extend down to the semiconductor layer, i.e., any contact areas formed therein. In particular, in densely packed device regions, the lateral size of the drain and source areas, and thus the available area for the contact regions, may be 100 nm and less, thereby requiring extremely complex lithography and etch techniques in order to form the contact openings with well-defined lateral dimensions and with a high degree of alignment accuracy, while the difference in etch depth may additionally contribute to the overall complexity of the patterning process. After exposing the contact areas, frequently provided in the form of metal silicide regions, a barrier material is frequently provided, for instance in the form of a material system including titanium and titanium nitride, wherein the titanium material may provide the required adhesion characteristics, while the titanium nitride material may preserve integrity of the interlayer dielectric material during the subsequent deposition of the tungsten material, which may be accomplished on the basis of sophisticated chemical vapor deposition (CVD) techniques in which a direct contact between silicon dioxide-based material and the deposition ambient for depositing the tungsten material is to be avoided. Typically, the actual deposition of the tungsten material may be preceded by the deposition of a nucleation layer based on tungsten, which may be accomplished by a dedicated deposition step, after which the actual fill material may be provided. After the deposition of these materials, any excess material may be removed, for instance by chemical mechanical polishing (CMP), thereby forming the isolated contact elements in the interlayer dielectric material. Although the process sequence for patterning the contact openings and filling these openings with barrier materials and tungsten results in contact elements having a desired contact resistivity for semiconductor devices with critical dimensions of 50 nm, a further reduction of the size of the transistors may result in an increased contact resistivity, which may no longer be compatible with the device requirements. That is, upon further device scaling, the increased contact resistivity, which may result from conventional tungsten-based contact regimes, may represent a limiting factor of the operating speed of the integrated circuits, thereby at least partially offsetting many advantages obtained by the further reduction of the critical dimensions in the device level.

For these reasons, other deposition strategies have been developed for filling high aspect ratio contact openings, such as electrochemical deposition and the like. Although in some of these approaches specific conductive barrier materials, such as titanium nitride, tantalum nitride and the like, may not be required, which thus may provide superior overall conductivity of the resulting contact elements, upon further device scaling, deposition-related irregularities, such as voids and the like, may significantly increase the overall contact resistance, as will be explained in more detail with reference to FIGS. 1a-1b.

FIG. 1a schematically illustrates a cross-sectional view of a semiconductor device 100 including a plurality of semiconductor-based circuit elements 150, which are formed in and above a semiconductor layer 102. The semiconductor layer 102 is formed above a substrate 101, such as a semiconductor material and the like. For example, the circuit elements 150 may represent field effect transistors comprising a gate electrode structure 151, which has any appropriate configuration in accordance with the overall device requirements. The gate electrode structure 151 comprises a contact area 155, which may be a portion of an electrode material and the like. Furthermore, the transistors 150 comprise drain and source regions 153 formed in a corresponding active region 102A, which represents a portion of the semiconductor layer 102 in which the PN junctions and thus dopant profiles of one or more transistors, such as the transistors 150, are formed. The drain and source regions 153 typically comprise a contact area 154, for instance in the form of metal silicide regions and the like. Moreover, the transistors 150 are embedded in a dielectric material 110, which is also referred to hereinafter as an interlayer dielectric material which thus represents a dielectric material formed so as to passivate the transistors 150 and any other semiconductor-based circuit elements and separate these circuit elements from a metallization system (not shown) that is to be formed above the interlayer dielectric material 110. As illustrated, the interlayer dielectric material 110 may comprise two or more different materials, such as a layer 111, for instance provided in the form of a silicon nitride material, followed by a further layer 112, such as a silicon dioxide material. Furthermore, contact elements 120A, 120B are formed in the interlayer dielectric material 110 and comprise an appropriate conductive material 122, such as tungsten, cobalt and the like, wherein, frequently, as discussed above, an activation material 121 is formed on sidewalls of the contact elements 120A, 120B and a bottom thereof in order to initiate, for instance, the electrochemical deposition of the actual fill material 122. Furthermore, as illustrated, the contact elements 120A, 120B extend to the contact areas 155, 154, respectively, and thus may extend to different height levels in the device 100, which is to be understood as the "vertical" distance of the bottom of the contact openings 120A, 120B from any appropriate reference plane, such as the interface formed between the semiconductor layer 102 and the substrate 101. In this sense, the height level of the bottom of the contact element 120B is less than the height level of the bottom of the contact opening 120A.

The semiconductor device 100 as illustrated in FIG. 1a may be formed on the basis of established process strategies in which the active region 102A and the circuit elements 150, for instance in the form of field effect transistors, may be fabricated in accordance with sophisticated process strategies. For example, the fabrication of the gate electrode structures 151 represents a very critical process phase, since, in sophisticated applications, a gate length 151L may be 50 nm and significantly less, thereby requiring sophisticated lithography and etch strategies. Moreover, complex material systems may be used, for instance in the form of high-k dielectric materials for a gate dielectric material, in combination with metal-containing electrode materials, depending on the overall device requirements. Similarly, the dopant profiles of the drain and source regions 153 may require appropriate manufacturing strategies. At any appropriate manufacturing stage prior to or after completing transistors 150 as shown in FIG. 1a, at least a portion of the interlayer dielectric material 110 is formed. For example, the layer 111 may be deposited on the basis of plasma assisted CVD techniques, followed by the deposition of the material 112, for instance using sub-atmospheric CVD and the like. Thereafter, the resulting surface topography is typically planarized, for instance by CMP, to provide superior process conditions for patterning the interlayer dielectric material 110 in order to form corresponding contact openings therein. For this purpose, any sophisticated process strategies are applied, for instance using hard mask materials and the like. Thereafter, the activation layer 121 or a conductive barrier layer is deposited, for instance by CVD, sputter deposition and the like, thereby preparing the device 100 for a subsequent deposition of the actual fill metal 122. As discussed above, the fill material 122 has to be filled into the contact openings having at least one lateral dimension that may be comparable to the critical dimensions of the transistors 150, thereby requiring sophisticated deposition techniques. However, certain deposition-related irregularities, for instance in the form of seam and voids 123, may nevertheless be created, even if highly non-conformal deposition recipes are applied, for instance by using electro-chemical deposition techniques. After filling in the conductive contact metal 122 and after removing any excess material, for instance by CMP and the like, thereby also removing any portions of the activation or barrier layer 121 from horizontal areas of the interlayer dielectric material 110, the seam voids 123 may contribute to further non-uniformities during the further processing and may also cause a significantly increased contact resistance, which may contribute to reduced overall device performance.

FIG. 1b schematically illustrates the semiconductor device 100 in a manufacturing stage in which the contact metal 122 is deposited so as to fill contact openings 110A, 110B based on deposition recipes in which a superior "bottom to top" fill behavior may be achieved in an attempt to reduce or avoid corresponding seams or voids, as, for instance, shown in FIG. 1a in the form of the voids 123. In this case, however, a significant risk of creating voids 124 at the upper portion of the contact openings 110A, 110B may exist, since, at a final phase of the deposition process, the growth of the material 122 at the top of the openings 110A, 110B may result in a "pinch off" of the deposition species, thereby forming the voids 124. Consequently, upon removing any excess material of the layer 122, the voids 124 may at least partially remain in the resulting contact elements and may thus contribute to further non-uniformities during the further processing and may also reduce the overall conductivity.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which contact elements in the contact level of the semiconductor device may be provided with reduced deposition-related irregularities, thereby improving process uniformity during the further processing and also enhancing overall conductivity of the contact elements. To this end, a superior bottom to top fill behavior may be accomplished by initiating the deposition of the conductive fill material on the basis of an activation material that is provided selectively at a lower part of the corresponding contact opening so that the deposition is initially "fed" by the lower part of the contact opening, while a corresponding pinch off effect at the upper part of the opening may be significantly suppressed due to the lack of the activation material at the upper part of the contact opening. Consequently, any appropriate selective deposition techniques may be applied with superior fill capabilities, such as electroless plating, selective CVD techniques, atomic layer deposition (ALD) and the like, in which the deposition of a desired fill material is initiated on the basis of an appropriate activation material.

One illustrative method disclosed herein relates to forming a contact element in a semiconductor device. The method comprises forming a contact opening in an interlayer dielectric material so as to connect to a contact area of a circuit element that is formed in a semiconductor region of the semiconductor device. The method further comprises forming an activation layer above the interlayer dielectric material and in the contact opening. The method additionally comprises removing a first portion of the activation layer from the interlayer dielectric material and from a portion of the contact opening while preserving a second portion of the activation layer at least at a bottom of the contact opening. Moreover, a selective deposition process is performed by using the second portion of the activation layer as an activation material for the deposition process so as to fill a conductive material into the contact opening. Additionally, the method comprises removing any excess material of the conductive material so as to form the contact element.

A further illustrative method disclosed herein comprises forming a first contact opening and a second contact opening in a dielectric material that is formed above and adjacent to a circuit element of a semiconductor device, wherein each of the first and second contact openings comprises an upper part and a lower part. The method further comprises forming an activation layer selectively on the lower part of the first and second contact openings. Additionally, the method comprises filling the first and second contact openings with a conductive material by performing a selective deposition process using the activation layer for initiating material deposition during the selective deposition process.

One illustrative semiconductor device disclosed herein comprises a circuit element formed in and above a semiconductor region and comprising a contact area. The semiconductor device further comprises an interlayer dielectric material formed above and adjacent to the circuit element. Additionally, the semiconductor device comprises a contact element formed in the interlayer dielectric material and connecting to the contact area, wherein the contact element comprises a conductive activation material selectively formed on a bottom of the contact element and on sidewalls of a lower part of the contact element. The contact element further comprises a conductive fill material that is formed in the lower part and in an upper part of the contact element.

BRIEF DESCRIPTION OF THE DRAWINGS

The disclosure may be understood by reference to the following description taken in conjunction with the accompanying drawings, in which like reference numerals identify like elements, and in which:

FIGS. 2a-2h schematically illustrate cross-sectional views of a semiconductor device during various manufacturing stages in forming contact elements by using an activation material that is provided in a lower part of the contact openings only, according to illustrative embodiments;

Figure 1A:
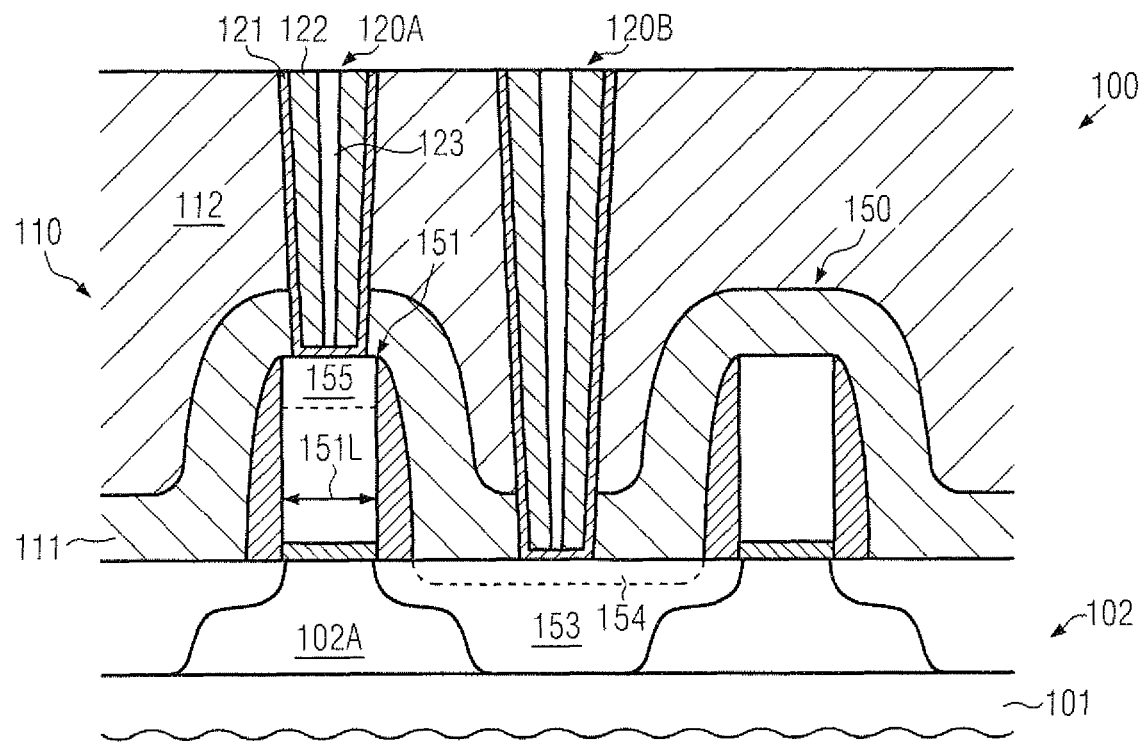
FIGS. 1a-1b schematically illustrate cross-sectional views of a semiconductor device including contact elements formed on the basis of conventional strategies, thereby creating deposition-related voids in the contact elements.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which a superior bottom to top fill behavior may be achieved during the deposition process for filling a conductive material into contact openings formed in the contact level of a semiconductor device. To this end, an appropriate activation material may be formed selectively in the lower part of a contact opening, thereby enabling performing selective deposition techniques in which the activation material initiates the deposition of the conductive fill material. Due to the selective positioning of the activation material in the lower part of the contact openings, any early deposition of the conductive material in the upper part of the contact opening may be suppressed, thereby achieving a superior filling of the contact openings. For example, on the basis of the selectively applied activation material, any appropriate selective deposition technique, such as electroless plating, selective CVD, selective ALD or metal organic CVD, for instance for depositing cobalt and any other appropriate metal species, may be applied and may thus exhibit the desired improved bottom to top fill behavior. In some illustrative embodiments disclosed herein, the activation material may be selectively formed in the lower parts of the contact openings by using a sacrificial material, such as a planarization material, as may also frequently be used in lithography processes for obtaining a substantially planar surface topography upon performing sophisticated lithography processes. For example, a plurality of polymer materials are available, which may be deposited on the basis of spin on techniques and the like in a highly viscous state, thereby reliably filling the contact openings so as to enable a subsequent controlled removal of a portion of the sacrificial fill material and thus controllably covering an activation material in the lower part of the contact openings upon removing the activation material selectively in the upper part of the contact openings. In further illustrative embodiments, different height levels of the sacrificial material or planarization material may be established in different contact openings, such that a controlled bottom to top fill behavior may be achieved in contact openings of different depth.

Figure 1B:
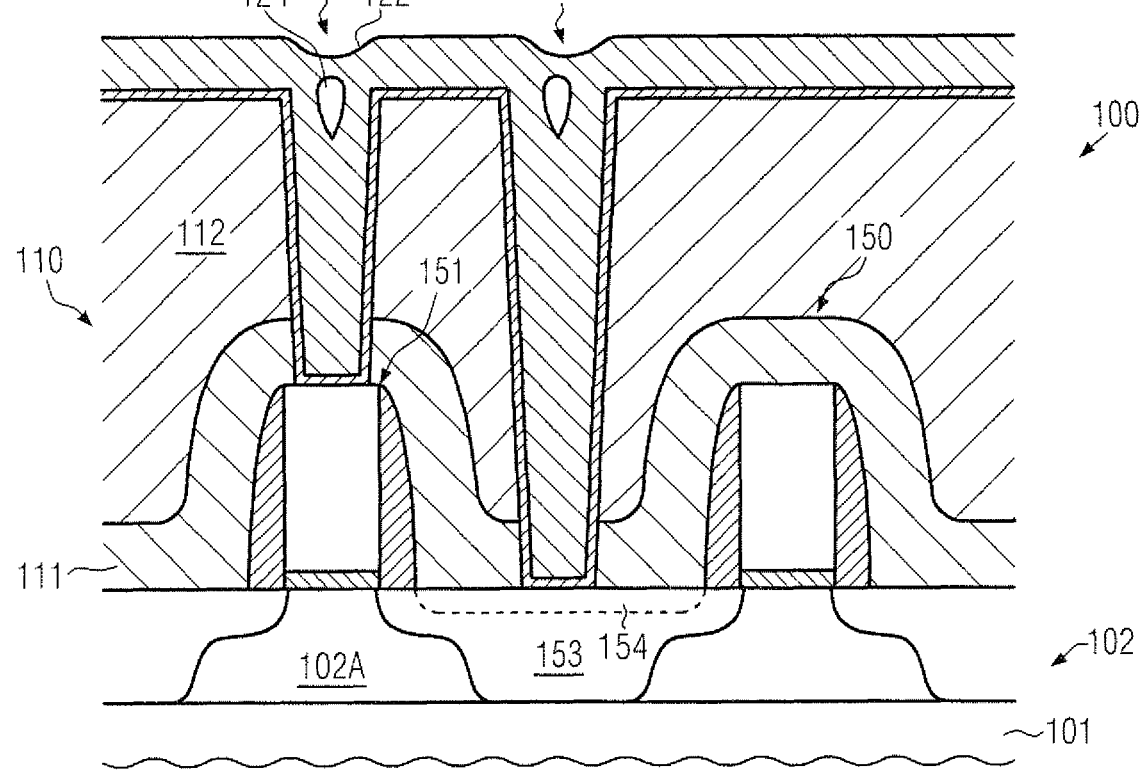

With reference to FIGS. 2a-2k, further illustrative embodiments will now be described in more detail, wherein reference may also be made to FIGS. 1a-1b, if required.

Figure 2A:
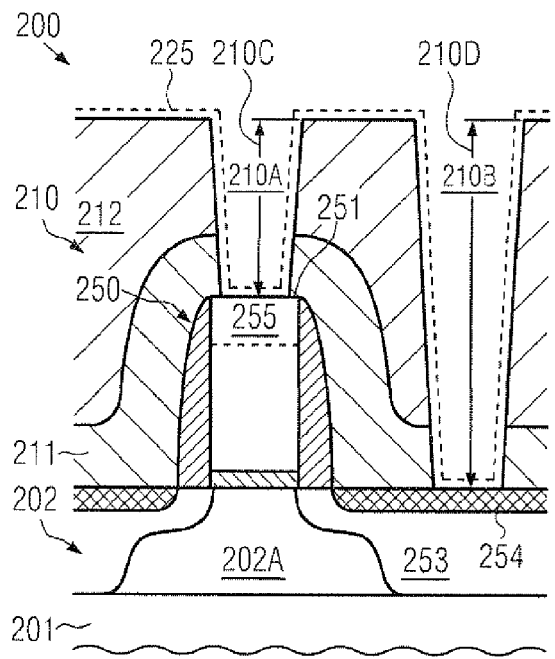

FIG. 2a schematically illustrates a cross-sectional view of a semiconductor device 200 comprising a substrate 201, above which may be formed a semiconductor layer 202. The semiconductor layer 202 and the substrate 201 may represent any appropriate configuration for forming semiconductor-based circuit elements 250, such as transistors, resistors, capacitors and the like, as are typically required in sophisticated integrated circuits. For example, the layer 202 and the substrate 201 may represent a silicon-on-insulator (SOI) configuration if a buried insulating material (not shown) is formed between the substrate 201 and the layer 202. In other cases, the semiconductor material 202 may represent a portion of a crystalline semiconductor material of the substrate 201, thereby forming a "bulk" configuration. The semiconductor layer 202 may comprise appropriate semiconductor regions or active regions 202A in and above which one or more of the circuit elements 250 may be formed in accordance with overall design rules. In the embodiment shown, the circuit element 250 may represent a field effect transistor comprising a gate electrode structure 251, which in turn may include a contact area 255. Furthermore, the circuit element 250 may comprise a contact area 254 formed in the semiconductor layer 202, for instance as a part of drain and source regions 253. It should be appreciated, however, that the circuit element 250 may represent any other circuit element that is formed on the semiconductor layer 202 or any isolation structures (not shown) formed therein, such as shallow trench isolations, wherein at least one contact area, such as the area 255 and/or 254, may have to be connected by a contact element still to be formed. The circuit element 250 may thus have the contact areas 255, 254 positioned at different height levels in the above-defined sense, while, in other cases, contact areas may be provided so as to be positioned at substantially the same height levels if, for instance, contact areas 254 of different circuit elements may be contacted by contact elements formed on the basis of a separate manufacturing flow, while contact areas 255 of various circuit elements may receive contact elements formed independently from other contact elements. Consequently, unless explicitly set forth in illustrative embodiments and/or the appended claims, the principles disclosed herein may be applied to any contact regime of semiconductor devices.

Moreover, the semiconductor device 200 may comprise a dielectric material which, as previously discussed with reference to the device 100, may also be referred to as an interlayer dielectric material 210 that is formed above and adjacent to the circuit elements 250. For example, the interlayer dielectric material 210 may comprise two or more individual material layers, such as a layer 211 and a layer 212, for instance comprised of silicon nitride, silicon dioxide and the like. Furthermore, a first contact opening 210A is formed in the interlayer dielectric material 210 so as to extend to the contact area 255 and thus has a first depth 210C. Similarly, a second contact opening 210B may be formed in the interlayer dielectric material 210 so as to extend to the contact area 254 and may thus have a depth 210D which, in the embodiment shown, may differ from the depth 210C. As discussed above, the contact openings 210A, 210B may have at least one lateral dimension, for instance, in FIG. 2a, the horizontal extension of the openings 210A, 210B, which may be 100 nm and significantly less, such as 50 nm and less, in order to comply with critical dimensions of the circuit element 250. In some illustrative embodiments, a conductive barrier layer 225 may be formed on the interlayer dielectric material 210 and thus within the openings 210A, 210B. The conductive barrier layer 225 may be comprised of any appropriate material or material system, such as titanium nitride, tantalum nitride, if a diffusion blocking effect may be required in view of any additional materials that may have to be formed at least partially within the openings 210A, 210B. For example, if an activation material to be formed in the contact openings 210A, 210B in a later manufacturing stage may have an increased diffusivity or may not be appropriate for acting as a diffusion barrier with respect to a conductive fill material to be provided in a later manufacturing stage, the layer 225 may be provided with an appropriate thickness and material composition in order to provide the required diffusion blocking capabilities. In other illustrative embodiments, as will be explained later on in more detail, a diffusion blocking layer or conductive barrier layer may be formed in an upper portion of the contact openings 210A, 210B in a later manufacturing stage, if required.

The semiconductor device 200 as shown in FIG. 2a may be formed on the basis of any appropriate process strategy to provide the active region 202A and forming therein and thereabove the circuit element 250. For example, similar process strategies may be applied as previously explained with reference to the semiconductor device 100. Consequently, after forming the interlayer dielectric material 210, the contact openings 210A, 210B may be formed on the basis of any appropriate lithography and patterning strategy. Thereafter, the optional conductive barrier layer 225 may be deposited, for instance, by any appropriate deposition technique, such as sputter deposition, CVD, ALD and the like. As discussed above, a thickness of the layer 225 may be selected so as to obtain the required diffusion blocking effect.

Figure 2B:
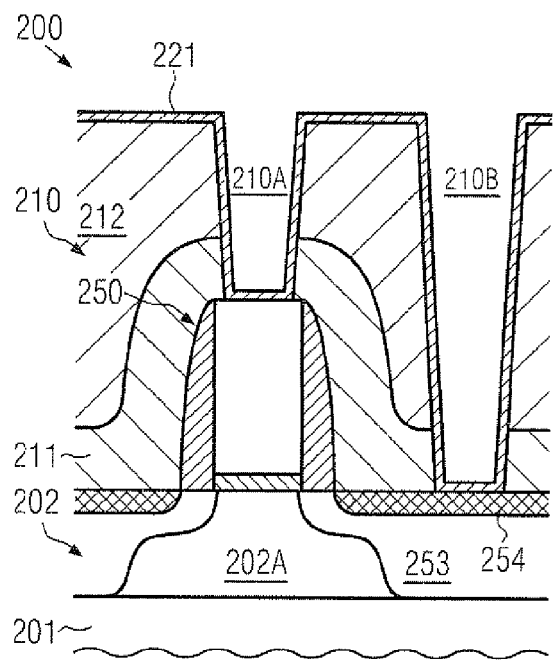

FIG. 2b schematically illustrates the semiconductor device 200 in a further advanced manufacturing stage. As illustrated, an activation material 221 may be formed above the interlayer dielectric material 210 and within the contact openings 210A, 210B, wherein it should be appreciated that the activation material 221 may be formed on the conductive barrier layer 225 (FIG. 2a) if superior diffusion blocking capabilities are required during the further processing of the device 200. In other illustrative embodiments, the layer 221 may itself act as an appropriate diffusion barrier for a further fill material still to be provided, while, in other cases, an appropriate conductive fill material may be used which may not require superior diffusion blocking capabilities. The activation material 221 may have any appropriate composition so as to enable the initialization of material deposition during a subsequent deposition process, thereby achieving a desired selective deposition behavior. For example, the activation material 221 may be comprised of cobalt, nickel, palladium, platinum and the like, which may thus act as catalyst materials during specific deposition processes, such as electroless plating, CVD processes, ALD, i.e., self-limiting CVD techniques and the like. The activation material 221 may be deposited in a highly conformal manner on the basis of CVD techniques, such as ALD and the like, for which a plurality of well-established deposition recipes are available.

Figure 2C:
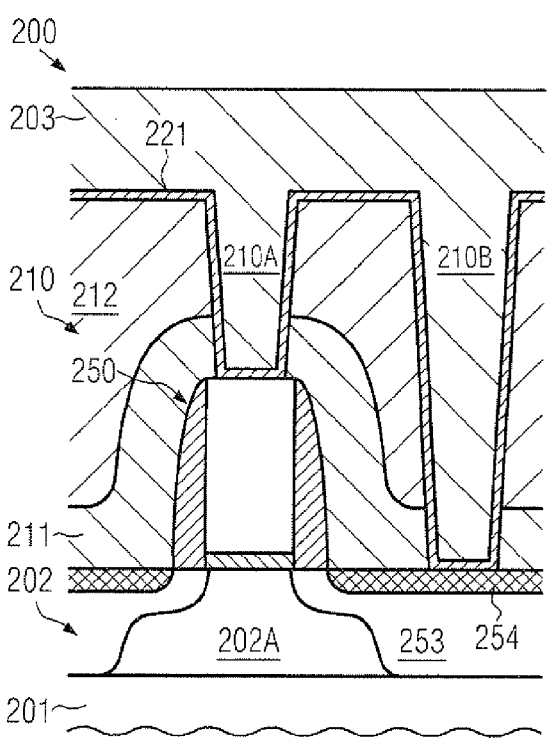

FIG. 2c schematically illustrates the semiconductor device 200 wherein a sacrificial material or planarization material 203 may be formed above the interlayer dielectric material 210 and may thus fill the openings 210A, 210B. The material 203 may be provided as a polymer material, which may have appropriate gap fill capabilities when deposited on a surface including a pronounced surface topography. For example, a plurality of polymer materials may be efficiently used as planarization materials during complex patterning processes and any such material may be efficiently used as the material 203. For example, the material 203 may be applied by spin-on techniques in a low viscous state, thereby obtaining a substantially planar surface topography. Thereafter, the material 203 may be cured or in any way treated, for instance by heat, radiation and the like.

Figure 2D:
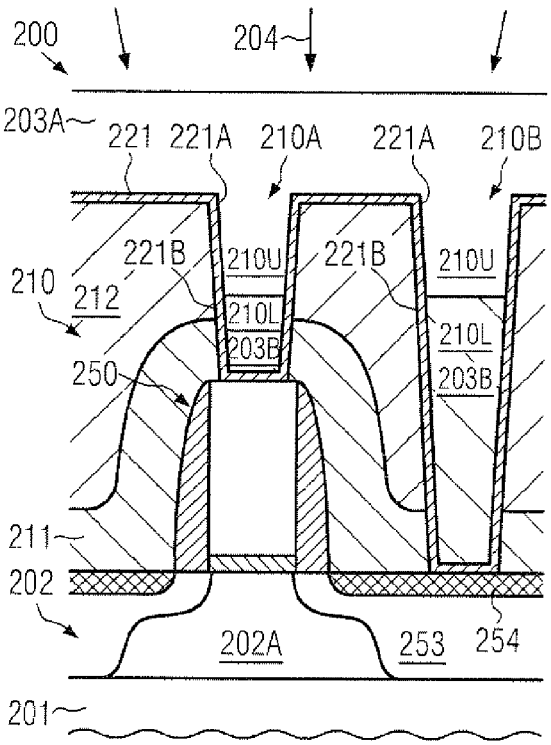

FIG. 2d schematically illustrates the semiconductor device 200 when exposed to a reactive process atmosphere 204, which may represent any appropriate material removal process for removing material of the sacrificial material 203 (FIG. 2c), while, in some illustrative embodiments (not shown), the reactive process 204 may also be configured to remove material of the layer 221. In the embodiment shown, the process 204 may be performed as an etch process, such as a plasma assisted etch process, a wet chemical etch process, a radiation-induced evaporation process and the like, in order to remove a first portion 203A of the material 203, thereby also defining an upper portion 210U in the first and second contact openings 210A, 210B. In the embodiment shown, the process 204 may be selective with respect to the material 221, thereby exposing a first portion 221A of the layer 221 in the upper part 210U of the first and second contact openings 210A, 210B. As discussed above, in other embodiments, the first portion 221A may also be removed during the etch process 204. Consequently, a second portion 203B may thus define a lower portion 210L in the first and second contact openings 210A, 210B, which, however, may have a different "vertical" extension and thus depth, since the height level of the preserved portions 203B may be substantially equal due to the previously provided substantially planar surface topography of the layer 203 and due to a relatively uniform removal behavior during the process 204. It should be appreciated that a plurality of wet chemical etch recipes are available, in which polymer materials may be removed selectively with respect to dielectric and conductive materials. Furthermore, plasma assisted etch recipes are available, for instance, on the basis of oxygen plasma and the like, in order to remove polymer materials in a highly controlled manner. Consequently, the height level of the remaining portion 203B in the openings 210A, 210B, may be controlled on the basis of process parameters of the process 204 for a given etch recipe so that the size of the upper part 210U and, thus, of first portions 221A may be appropriately selected in order to avoid deposition-related irregularities during the further processing when filling in the actual contact metal.

FIG. 2e schematically illustrates the semiconductor device 200 in a further advanced manufacturing stage. As illustrated, the device 200 may be exposed to a further reactive process ambient 205, which may be configured in order to remove the first portion 221A (FIG. 2d) of the activation material in the presence of the remaining portion 203B of the planarization material. For this purpose, the reactive process ambient 205 may be established on the basis of wet chemical etch recipes, plasma assisted etch recipes for obtaining a substantially isotropic etch behavior and the like. For this purpose, a plurality of chemistries are available for etching a plurality of conductive materials. As previously explained, in some illustrative embodiments, the removal of this portion of the planarization material 203A (FIG. 2d) and of the first portion of the activation material 221A may be accomplished in a common process sequence, if considered appropriate. In the embodiment shown in FIG. 2e, the remaining portion 203B may act as an efficient etch stop material and may, thus, preserve the second portion 221B of the activation material. Thereafter, the process 205 may include a further process step in order to remove the portion 203B as indicated by the dashed lines. For this purpose, any appropriate wet chemical or plasma assisted chemistries may be applied. Consequently, the lower part 210L may comprise the second portions 221B of the activation material, whereas the upper parts 210U may lack at least significant amounts of the activation material, thereby suppressing a significant material growth during the filling in of a conductive contact metal in a later manufacturing stage.

FIG. 2f schematically illustrates the semiconductor device 200 in accordance with embodiments in which the conductive barrier material 225 may be provided. In the embodiment shown, the conductive barrier material 225 may be provided in the upper part 210U and the lower part 210L, thereby obtaining a diffusion blocking effect for the contact openings 210A, 210B in view of the deposition of a corresponding contact metal. For this purpose, the preceding etch process, such as the process 205 for removing the first portion of the activation material, may be performed as a selective etch process, in which the conductive barrier material 225 may act as an efficient etch stop material. As indicated above, for this purpose, well-established selective etch recipes, such as wet chemical etch recipes or plasma assisted etch recipes, may be applied. In other illustrative embodiments, as will be explained later on in more detail, an additional conductive barrier material may be selectively formed in the upper parts 210U, if a significant material erosion or a complete removal of the material 225 may occur during the patterning of the activation material 221B. In other embodiments, the activation material 221B may act as an efficient diffusion blocking material and an additional diffusion blocking material without any catalytic characteristics may be selectively formed in the upper parts 210U, as will also be described later on in more detail.

FIG. 2g schematically illustrates the semiconductor device 200 in a further advanced manufacturing stage in which a deposition process 206 may be performed so as to deposit a conductive material, for instance in the form of any appropriate metal and the like, into the contact openings 210A, 210B in a selective manner by using the activation materials 221B as a material for initiating the deposition of the material 222. In this sense, the deposition process 206 may be considered as a selective deposition process, since the growing of the material 222 may start on the material 221B, while any initial deposition on other surface areas, such as the interlayer dielectric material 210, may be suppressed. For example, the deposition process 206 may represent an electroless plating process performed on the basis of an appropriate electrolyte solution, wherein a desired metal species, such as cobalt, copper, nickel, a cobalt/tungsten/phosphorous compound, a nickel/molybdenum/phosphorous compound and the like may efficiently be deposited. It should be appreciated that corresponding electrochemical deposition recipes are well established in the field of semiconductor fabrication, for instance for forming appropriate metallization systems and the like. In other cases, the deposition process 206 may represent CVD-like deposition processes, such as ALD and the like, in which, however, an initial deposition may be substantially restricted to the activation material 221B, thereby also achieving a superior bottom to top fill behavior. For instance, a plurality of metal materials may be deposited on the basis of metal-containing CVD precursor gases, wherein the initial deposition may occur at an appropriate metal surface, while deposition on dielectric surface areas is significantly less pronounced.

FIG. 2h schematically illustrates the semiconductor device 200 during a removal process 207 in order to remove any excess material of the contact elements 220A, 220B, if required. For example, the removal process 207 may be performed as a CMP process, an electrochemical etch process, a brush clean process or a wet chemical etch process or a plasma assisted etch process or any combination of any of these process techniques. Consequently, the contact elements 220A, 220B may be reliably isolated from each other and may comprise an upper portion which lacks the activation material, while in a lower portion 210L the activation material 221B may be provided. It should be appreciated that, additionally, the conductive barrier material 225 as shown in FIG. 2f may be present in the contact elements 220A, 220B, if an increased diffusion blocking capability may be required, as is also explained above.

Figure 2I:
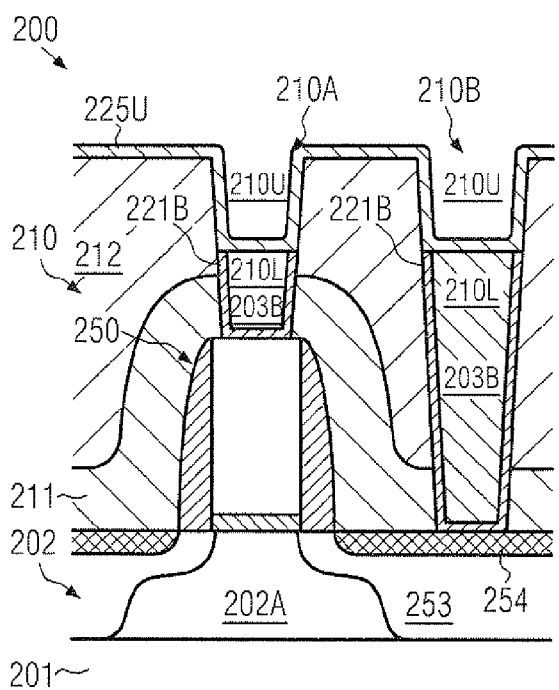
FIGS. 2i-2j schematically illustrate cross-sectional views of the semiconductor device during manufacturing stages in which a conductive barrier layer is selectively provided in an upper part of contact openings, according to further illustrative embodiments.
Figure 2J:
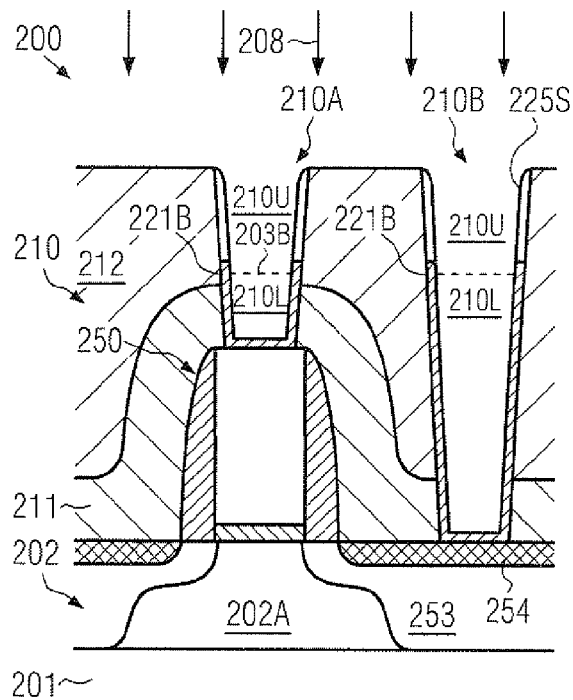

With reference to FIGS. 2i and 2j, further illustrative embodiments will now be described in which an additional conductive barrier material may be formed in the upper part of the contact openings.

FIG. 2i schematically illustrates the semiconductor device 200 in a manufacturing stage in which the contact openings 210A, 210B comprise the sacrificial material 203B and the activation material 221B in the lower part, while a conductive barrier material 225U is formed above the interlayer dielectric material 210 and in the upper part 210U. It should be appreciated that, if the activation material 221B may not provide sufficient diffusion blocking capability, a conductive barrier material may also be provided in the lower parts 210L, for instance in the form of the material 225, as previously shown in FIG. 2a or 2f. The additional conductive barrier material 225U may comprise any appropriate material which may provide superior diffusion blocking capabilities, while not acting as a catalyst material during the further processing of the device 200. For instance, titanium nitride, tantalum nitride and the like may be used as material of the layer 225U. The material 225u may be deposited on the basis of any appropriate deposition technique, wherein a process temperature may be appropriately selected so as to be compatible with the material characteristics of the sacrificial material 203B. For example, during sputter deposition processes, a moderately low temperature of approximately 300° C. and less may be applied.

FIG. 2j schematically illustrates the semiconductor device 200 when exposed to an anisotropic etch process 208, in which the material 225U (FIG. 2i) may be etched selectively with respect to the material 203B and, if material erosion of the interlayer dielectric material 210 is considered inappropriate, also selectively with respect to the material 210. Consequently, during the etch process 208, "sidewall spacers" 225S may be formed in the upper part 210U of the contact openings 210A, 210B, while the material 203B may preserve integrity of the materials 221B. Thereafter, the material 203B may be removed on the basis of any appropriate process technique, as discussed above. Consequently, the openings 210A, 210B may have superior diffusion blocking abilities due to the material 225S in the upper parts 210U and the material 221B, possibly in combination with the material 225 (FIG. 2f), in the lower part 210L. Consequently, the further processing may be continued by depositing the conductive fill material, such as copper and the like, which may require superior confinement, which may also be achieved in the upper part 210U, if a conductive barrier material may have been removed upon patterning the material 221B or when a corresponding conductive barrier material is not provided, since the material 221B may itself act as an efficient diffusion barrier. On the other hand, a significant initial material deposition on the spacers 225S may be suppressed.

Figure 2K:
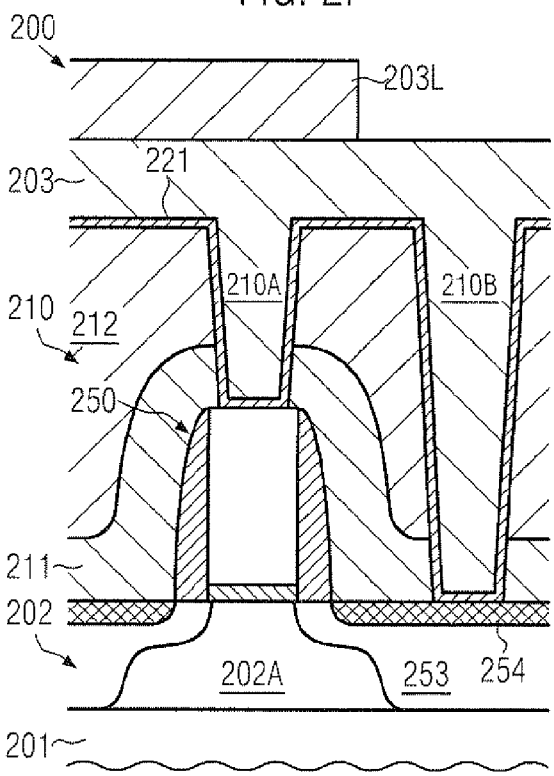
FIGS. 2k-2l schematically illustrate cross-sectional views of the semiconductor device during various manufacturing stages in forming the activation material in contact openings of different depth so as to extend to different height levels, according to still further illustrative embodiments.
Figure 2L:
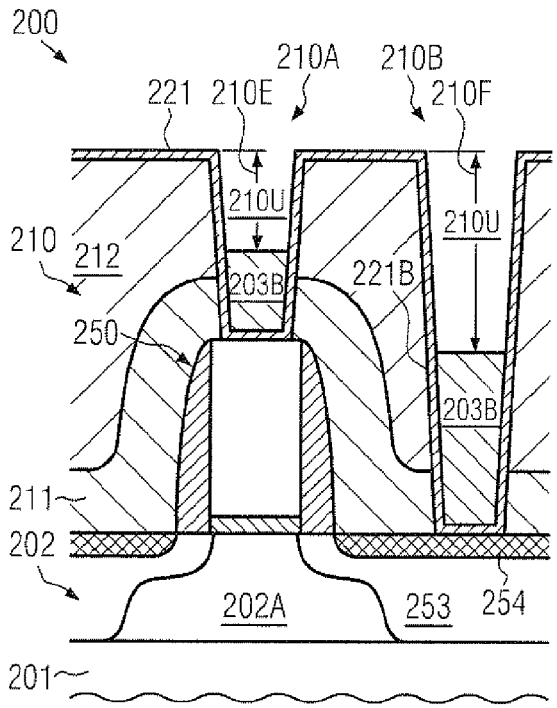

With reference to FIGS. 2k-2l, further illustrative embodiments will now be described in which the lower parts of the contact openings may extend to different height levels in order to additionally control the bottom to top fill behavior.

FIG. 2k schematically illustrates the semiconductor device 200 in a manufacturing stage in which the sacrificial material 203 may be formed in the openings 210A and 210B and may also be formed above the interlayer dielectric material 210. Moreover, an additional sacrificial material 203L or mask material may be provided so as to be formed above the opening 210A while exposing the portion of the layer 203 formed above the contact opening 210B. The additional material or mask material 203L may be provided on the basis of well-established lithography techniques, for instance, by forming a resist material and exposing and developing the material in accordance with well-established recipes. Based on the material 203L, a removal process may be performed, for instance as previously explained with reference to FIG. 2d, wherein, however, due to the presence of the additional material 203L, the etch front may proceed deeper into the contact opening 210B and, thus, for a given etch time, a difference in height level of the remaining portion of the material 203 may be accomplished for the contact openings 210A, 210B. In other cases, a first etch step may be performed so as to remove a portion of the material 203 exposed by the mask 203L, which may subsequently be removed selectively with respect to the material 203, which may then further be etched, thereby also obtaining different height levels of the remaining material 203 in the contact openings 210A, 210B.

FIG. 2I schematically illustrates the semiconductor device 200 with the remaining portions 203B in the openings 210A, 210B, thereby defining the upper parts 210U so as to extend to different height levels. That is, the upper part 210U of the first contact opening 210A may have a depth 210E, which may be appropriately selected so as to obtain the desired bottom to top fill behavior during the subsequent processes. On the other hand, the upper part 210U of the second contact opening 210B has a depth 210F that is greater than the depth 210E, i.e., the upper parts 210U extend to different height levels within the first and second contact openings 210A, 210B. Consequently, during the further processing, i.e., the removal of the exposed portion of the layer 221, the remaining portion 221B of the activation material in the opening 210B may also extend to a lower height level, thereby providing superior process margins during the subsequent selective deposition process, since any deposition on sidewalls of the upper part 210U, which may now extend to a greater depth, may be suppressed. Consequently, an appropriate bottom to top fill behavior may be obtained, even if a significant difference in depth of the initial contact openings 210A, 210B exists. The processing may then be continued on the basis of process techniques as previously described. For instance, with respect to providing any barrier layers, the same criteria may apply as previously explained.

As a result, the present disclosure provides semiconductor devices and manufacturing techniques in which a superior bottom to top fill behavior may be achieved by providing an activation material in a lower part of the contact openings only so that the initial material growth during the subsequent filling in of the conductive contact metal may be restricted to the lower parts of the contact openings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a contact element in a semiconductor device, the method comprising:

forming a contact opening in an interlayer dielectric material, said contact opening connecting to a contact area of a circuit element formed in and above a semiconductor region of said semiconductor device;

forming an activation layer above said interlayer dielectric material and in said contact opening;

removing a first portion of said activation layer from said interlayer dielectric material and from upper sidewall portions of said contact opening while preserving a second portion of said activation layer at least at a bottom of said contact opening;

after removing said first portion of said activation layer, forming a barrier layer in said contact opening;

performing an etch process so as to form a liner from said barrier layer selectively on said upper sidewall portions of said contact opening;

performing a selective deposition process by using said second portion of said activation layer as an activation material of said deposition process so as to fill a conductive material into said contact opening; and removing any excess material of said conductive material so as to form said contact element.

2. The method of claim 1, wherein removing said first portion of said activation layer comprises providing a sacrificial material so as to fill said contact opening and removing a first portion of said sacrificial material so as to preserve a second portion of said sacrificial material that covers said second portion of said activation layer.

3. The method of claim 2, wherein removing said first portion of said activation layer further comprises removing said first portion of said sacrificial material selectively to said first portion of said activation layer and removing said exposed first portion of said activation layer by using said second portion of said sacrificial material as an etch mask.

4. The method of claim 2, wherein removing said first portion of said activation layer further comprises performing an etch process so as to commonly remove said first portions of said sacrificial material and said activation layer.

5. The method of claim 1, further comprising forming a first barrier layer in said contact opening prior to forming said activation layer.

6. The method of claim 2, further comprising forming a second contact opening in said interlayer dielectric material so as to extend to a depth that is greater than a depth of said contact opening and providing said sacrificial material so as to fill said contact opening and said second contact opening.

7. The method of claim 6, wherein removing said first portion of said sacrificial material comprises removing material of said sacrificial material from said second contact opening so as to preserve a third portion of said sacrificial material in said second contact opening, wherein a height level of said third portion of said sacrificial material in said second contact opening differs from a height level of said second portion of said sacrificial material in said contact opening.

8. The method of claim 7, wherein removing said first portion of said sacrificial material comprises performing a first removal process so as to reduce a thickness of said first portion of said sacrificial material selectively above said second contact opening.

9. The method of claim 6, further comprising forming said barrier layer in said second contact opening and forming a second liner from said barrier layer on upper sidewall portions of said second contact opening.

10. The method of claim 1, wherein performing said selective deposition process comprises performing an electroless plating process.

11. A method, comprising:

forming a first contact opening and a second contact opening in a dielectric material formed above and adjacent to a circuit element of a semiconductor device, each of said first and second contact openings comprising an upper part and a lower part;

selectively forming an activation layer in said first and second contact openings, said selectively formed activation layer covering at least sidewall and bottom surfaces of said lower parts and exposing sidewall surfaces of said upper parts of said first and second contact openings;

selectively forming sidewall spacers on said exposed sidewall surfaces of said upper parts of said first and second contact openings, said sidewall spacers comprising a conductive barrier material; and filling said first and second contact openings with a conductive material by performing a selective deposition process using said activation layer for initiating material deposition during said selective deposition process.

12. The method of claim 11, wherein said first contact opening has a first depth and said second contact opening has a second depth that is greater than said first depth and wherein said activation layer is formed so as to extend to substantially the same height level in said first and second contact openings.

13. The method of claim 11, wherein said first contact opening has a first depth and said second contact opening has a second depth that is greater than said first depth and wherein said activation layer is formed so as to extend to a first height level in said first contact opening and to a second height level in said second contact opening and wherein said second height level is lower than said first height level.

14. The method of claim 11, further comprising forming a barrier layer prior to forming said activation layer.

15. The method of claim 11, wherein selectively forming said activation layer comprises forming a planarization material so as to fill said first and second contact openings and remove a portion of said planarization material so as to expose said sidewall surfaces of said upper parts and cover said at least said sidewall and bottom surfaces of said lower parts of said first and second contact openings.

16. A method, comprising:

forming a first contact opening in an interlayer dielectric material, said first contact opening connecting to a contact area of a circuit element formed in and above a semiconductor region of a semiconductor device;

forming a second contact opening in said interlayer dielectric material so as to extend to a depth that is greater than a depth of said first contact opening;

forming an activation layer above said interlayer dielectric material and in at least said first contact opening;

forming a sacrificial material above said interlayer dielectric material, said sacrificial material filling said first and second contact openings;

selectively removing a first portion of said sacrificial material from said second contact opening;

after selectively removing said first portion of said sacrificial material, removing a second portion of said sacrificial material from said first contact opening and a third portion of said sacrificial material from said second contact opening while preserving a fourth portion of said sacrificial material in said first contact opening and a fifth portion of said sacrificial material in said second contact opening, wherein a height level of said fourth portion of said sacrificial material differs from a height level of said fifth portion of said sacrificial material, a first portion of said activation layer is exposed in said first contact opening, and a second portion of said activation layer is covered by said fourth portion of said sacrificial material;

removing at least a portion of said activation layer from above said interlayer dielectric material and said first portion of said activation layer from said first contact opening while preserving said second portion of said activation layer at least at a bottom of said first contact opening;

performing a selective deposition process by using said second portion of said activation layer as an activation material of said deposition process so as to fill a conductive material into at least said first contact opening; and removing any excess material of said conductive material so as to form said contact element.

17. The method of claim 15, wherein selectively forming said sidewall spacers on said exposed sidewall surfaces of said upper parts of said first and second contact openings comprises:

forming a layer comprising said conductive barrier material adjacent to said exposed sidewall surfaces of said upper parts of said first and second contact openings and above said planarization material covering said lower parts of said first and second contact openings; and performing an anisotropic etch process to remove said layer from above said planarization material.

\* \* \* \* \*